United States Patent
Eun (10) Patent No.: US 9,018,708 B2
(45) Date of Patent: Apr. 28, 2015

(54) SEMICONDUCTOR DEVICE AND METHOD FOR FABRICATING THE SAME

(71) Applicant: SK Hynix Inc., Gyeonggi-do (KR)

(72) Inventor: Byung-Soo Eun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/717,595

(22) Filed: Dec. 17, 2012

(65) Prior Publication Data
US 2014/0061806 A1 Mar. 6, 2014

(30) Foreign Application Priority Data
Aug. 31, 2012 (KR) .................. 10-2012-0096386

(51) Int. Cl.
*H01L 27/088* (2006.01)
*H01L 27/108* (2006.01)

(52) U.S. Cl.
CPC ........ H01L 27/088 (2013.01); H01L 27/10894 (2013.01); *H01L 27/10823* (2013.01); H01L 27/10885 (2013.01); H01L 27/10888 (2013.01)

(58) Field of Classification Search
CPC ............... H01L 27/10894; H01L 27/10876; H01L 27/10885; H01L 27/10897; H01L 27/10888; H01L 29/4236
USPC ............. 257/330, E21.384, E21.66, E27.097, 257/E21.678, E21.683, E21.691, E21.657, 257/E21.658; 438/270, 589
See application file for complete search history.

(56) References Cited

U.S. PATENT DOCUMENTS 7,915,121 B1 * 3/2011 Kim .............................. 438/259
2010/0059894 A1 * 3/2010 Nguyen Hoang et al. .... 257/774

FOREIGN PATENT DOCUMENTS

KR 1020110003039 1/2011

OTHER PUBLICATIONS

Translation of KR20110003039.*

* cited by examiner

*Primary Examiner* — Whitney T Moore
(74) *Attorney, Agent, or Firm* — IP & T Group LLP (57) ABSTRACT

A semiconductor device includes a substrate including a cell region and a peripheral circuit region, buried gates formed in the substrate of the cell region, a bit line formed over the cell region between the buried gates and including a first barrier layer, and a gate formed over the peripheral circuit region and including a second barrier layer and a third barrier layer.

17 Claims, 12 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2012-0096386, filed on Aug. 31, 2012, which is incorporated herein by reference in its entirety.

BACKGROUND

1. Field

Exemplary embodiments of the present invention relate to a fabrication technology of a semiconductor device, and more particularly, to a semiconductor device having a buried gate and a method for fabricating the same.

2. Description of the Related Art

As a semiconductor fabrication process is performed in a minute scale, it is difficult to maintain and achieve various element characteristics and processes. Particularly, in 40 nm or less, there is a limitation in forming a gate structure, a bit line structure, a contact structure and the like. Even if the structure is formed, it is difficult to ensure desired device characteristics. In this regards, recently, there has been introduced a buried gate (BG) formed by burying a gate in a substrate. Since an entire gate structure is buried in the substrate, it is possible to easily ensure channel length and width, and to reduce parasitic capacitance which is generated between a gate and a bit line as compared with a planar gate or a recess gate.

Meanwhile, in a semiconductor device having a cell region and a peripheral circuit region, since a buried gate is formed in the cell region, a stepped portion is generated between the cell region and the peripheral circuit region by a height of a peri-gate formed in the peripheral circuit region. To effectively utilize such a stepped portion, a gate bit line (GBL) process of simultaneously forming the peri-gate of the peripheral circuit region and a bit line of the cell region has been introduced.

However, in the GBL process according to the conventional art, since the bit line of the cell region and the peri-gate of the peripheral circuit region are simultaneously formed, a bit line having a large height corresponding to the height of the peri-gate is formed, resulting in an increase in parasitic capacitance between bit lines in the cell region. Therefore, a bit line sensing margin is reduced.

SUMMARY

Exemplary embodiments of the present invention are directed to a semiconductor device capable of increasing a bit line sensing margin and a method for fabricating the same.

In accordance with an embodiment of the present invention, a semiconductor device includes a substrate including a cell region and a peripheral circuit region buried gates formed in the substrate of the cell region, a bit line formed over the cell region between the buried gates and including a first barrier layer, and a gate formed over the peripheral circuit region and including a second barrier layer and a third barrier layer.

In accordance with another embodiment of the present invention, a method for fabricating a semiconductor device includes forming a cell region and a peripheral circuit region in a substrate, forming a first conductive layer over the substrate including the cell region and the peripheral circuit region, forming a first barrier layer over the first conductive layer, etching the first barrier layer and the first conductive layer to form a bit line contact plug in the cell region, forming a second barrier layer over the cell region and the peripheral circuit region, forming a second conductive layer over the second barrier layer, and etching the second barrier layer, the second conductive layer to form a bit line on the cell region, and etching the first barrier layer, the second barrier layer, and the second conductive layer to form a gate in the peripheral circuit region.

According to the present technology, a stack structure of a barrier layer formed on a bit line of a cell region and a stack structure of a barrier layer formed on a peri-gate of a peripheral circuit region are allowed to be different from each other to provide the bit line having a height lower than that of the peri-gate, so that parasitic capacitance between bit lines may be reduced. Consequently, a bit line sensing margin may increase.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" not only means "directly on" something but also include the meaning of "an" something with an intermediate feature or a layer therebetween, and that "over" not only means the meaning of "over" something may also include the meaning it is "over" something with no intermediate feature or layer therebetween (i.e., directly on something).

An embodiment of the present invention provides a semiconductor device capable of increasing a bit line sensing margin by reducing parasitic capacitance between bit lines, which is caused by simultaneously forming a bit line of a cell region and a peri-gate of a peripheral circuit region in the semiconductor device including a buried gate formed in the cell region, and a method for fabricating the same. To this end, in the embodiment of the present invention, a gate bit line (GBL) process may be used to simultaneously form the bit line of the cell region and the peri-gate of the peripheral circuit region, and a stack structure of a barrier layer formed on the bit line may be different from a stack structure of a barrier layer formed on the peri-gate, so that the height of the bit line is reduced compared to the peri-gate. Therefore the parasitic capacitance between bit lines may be reduced.

Figure 1A:
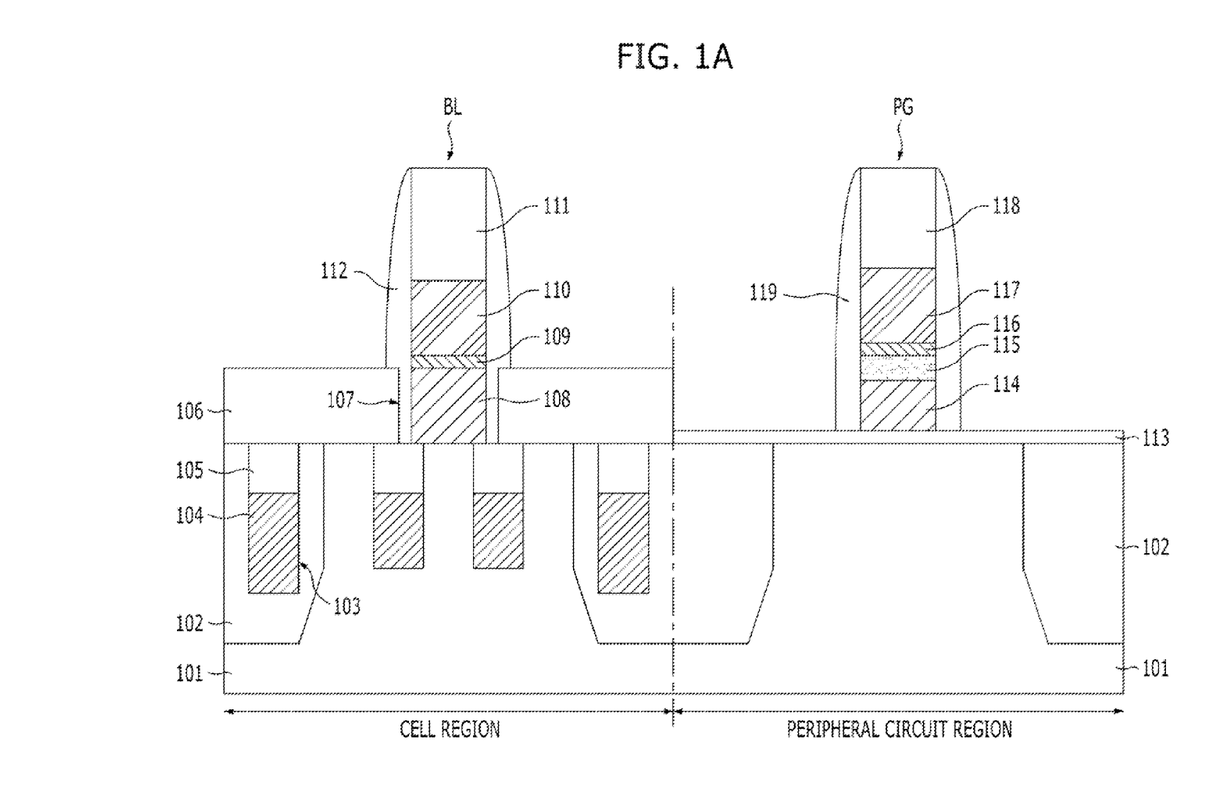
FIG. 1A is a sectional view illustrating a semiconductor device in accordance with an embodiment of the present invention.
Figure 1B:
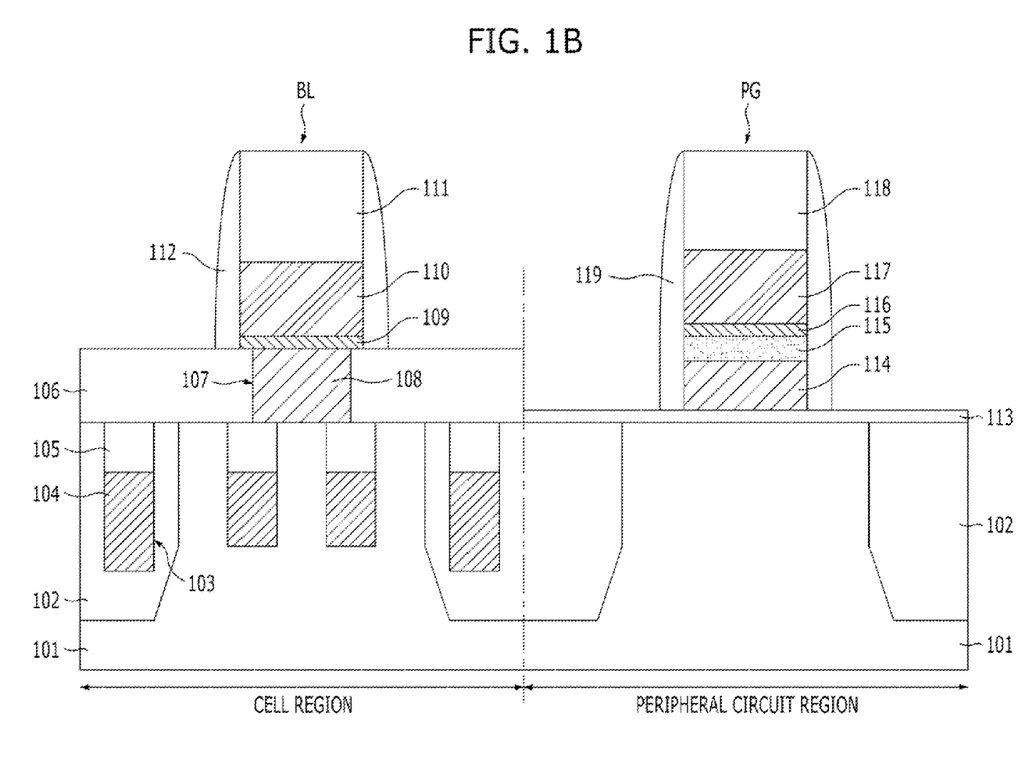
FIG. 1B is a sectional view illustrating a modification example of a semiconductor device in accordance with an embodiment of the present invention.

FIG. 1A is a sectional view illustrating a semiconductor device in accordance with an embodiment of the present invention, and FIG. 1B is a sectional view illustrating a modification from the embodiment of the present invention.

As illustrated in FIGS. 1A and 1B, a substrate 101 includes a cell region and a peripheral circuit region, and an active region is formed in the cell region and the peripheral circuit region by an isolation layer 102 formed in the substrate 101. The substrate 101 may include a silicon substrate and the isolation layer 102 may include a shallow trench isolation (STI).

The substrate 101 of the cell region is formed with a plurality of buried gates. The buried gate may include a trench 103 formed in the substrate 101, a gate dielectric layer (not illustrated) formed on the surface of the trench 103, a gate electrode 104 for partially filling the trench 103 on the gate dielectric layer, and a capping layer 105 for filling the trench 103 on the gate electrode 104. The trench 103 may include a line pattern that simultaneously crosses the isolation layer 102 and the active region, and the depth of the trench 103 formed in the isolation layer 102 may be substantially equal to or deeper than the depth of the trench 103 formed in the active region. In the latter case, since the active region below the trench 103 has a pin structure, the gate may be effectively controlled.

On the substrate 101 of the cell region including the buried gates, an interlayer dielectric layer 106 and a bit line control plug 108 which makes contact with the substrate 101 between the buried gates by passing through the interlayer dielectric layer 106, are formed. The bit line control plug 108 may have a structure in which a conductive material is filled in a contact hole 107 formed in the interlayer dielectric layer 106 (refer to FIG. 1B), or may have a structure in which an insulation material, for example, a bit line spacer 112, is inserted between a sidewall of the contact hole 107 and a sidewall of the bit line control plug 108 (refer to FIG. 1A).

The interlayer dielectric layer 106 may include a single layer that comprises an oxide layer, a nitride layer, and an oxide nitride layer, or a stack layer thereof. The bit line control plug 108 may include a silicon-containing layer. The silicon-containing layer may include an impurity for improving conductivity. For example, the silicon-containing layer may include a polysilicon layer.

On the interlayer dielectric layer 106 including the bit line control plug 108, a bit line BL is formed. The bit line BL may include a first barrier layer 109 formed on the bit line control plug 108, a bit line electrode 110 on the first barrier layer 109, and a first hard mask layer 111 on the bit line electrode 110. The bit line electrode 110 may include a metallic layer, which is a low resistance material, and the first hard mask layer 111 may include an insulation layer. For example, the bit line electrode 110 may include a tungsten layer (W) and the first hard mask layer 111 may include a nitride layer.

The first barrier layer 109 may include a stack layer in which layers with different materials have been stacked. In detail, the first barrier layer 109 may include a stack layer in which a layer containing first material ("first layer"), a layer containing second material ("second layer") on the first layer, and a layer containing third material ("third layer") on the second layer are sequentially stacked, wherein the first layer may improve contact resistance with the bit line control plug 108, the second layer may prevent mutual diffusion between the bit line control plug 108 and the bit line electrode 110, and the third layer may increase a grain size of the bit line electrode 110 to reduce resistance of the bit line electrode 110.

The first layer may include a material capable of forming ohmic contact (for example, metal silicide) by reacting with the bit line control plug 108 including the silicon-containing layer. For example, the first layer may include a titanium layer (Ti).

The second layer may include a material capable of forming a diffusion barrier layer for substantially preventing mutual diffusion between the bit line control plug 108 and the bit line electrode 110. For example, the second layer may include a tungsten nitride layer (WN). In relation to the tungsten nitride layer, a first material layer during a process, that is, a titanium layer reacts with nitrogen of the tungsten nitride layer to form a titanium nitride layer on the interface thereof, and the titanium nitride layer may perform a function of the diffusion barrier layer for substantially preventing mutual diffusion between the bit line control plug 108 and the bit line electrode 110.

The third layer may include a material capable of increasing the grain size of the bit line electrode 110 including the tungsten layer to reduce the resistance of the bit line electrode 110. For example, the third layer may include a tungsten silicon nitride layer (WSiN). The tungsten silicon nitride layer has an amorphous state, and serves as a kind of seed for the tungsten layer to increase the grain size of the tungsten layer. As the grain size of the tungsten layer increases, the resistance of the tungsten layer decreases.

The first hard mask layer 111 formed on the bit line electrode 110 may include an insulation layer capable of substantially preventing an insulation material from being formed between the bit line electrode 110 and the first hard mask layer 111 during a process. For example, the first hard mask layer 111 formed on the bit line electrode 110 including the tungsten layer may include a low-pressure nitride layer (LP-Nitride) formed at a low-pressure using a furnace. At this time, pressure is 0.25 torr.

A peri-gate PG is formed on the substrate of the peripheral circuit region. The peri-gate PG may include a stack structure in which a gate dielectric layer 113, a first gate electrode 114, a second barrier layer 115, a third barrier layer 116, a second gate electrode 117, and a second hard mask layer 118 are sequentially stacked.

The first gate electrode 114, the second gate electrode 117, and the second hard mask layer 118 may include substantially the same material as those of the bit line control plug 108, the bit line electrode 110, and the first hard mask layer 111 of the cell region, respectively. This is because they are simultaneously formed through the GBL process. Accordingly, the first gate electrode 114 may include a silicon-containing layer, wherein the silicon-containing layer may include a silicon-containing layer doped with an impurity. In detail for the doping of the first gate electrode 114, a conductive type of an impurity to be doped is determined based on a conductive type of the peri-gate PG. For example, when the peri-gate PG has a p-type channel, the first gate electrode 114 may include a silicon-containing layer doped with a p-type impurity. The second gate electrode 117 may include a metallic layer, for example, a tungsten layer. The second hard mask layer 118 may include an insulation layer, for example, a low-pressure nitride layer formed in a furnace.

The second barrier layer 115 and the third barrier layer 116 may have substantially the same structure as that of the first barrier layer 109. That is, the second barrier layer 115 and the third barrier layer 116 may include a stack layer in which a first layer, a second layer, and a third layer are sequentially stacked, which is similar to the first barrier layer 109. In detail, the second barrier layer 115 and the third barrier layer 116 may include a stack layer in which a titanium layer, a tungsten nitride layer, and a tungsten silicon nitride layer are sequentially stacked.

The thickness of the second barrier layer 115 may be greater than that of the third barrier layer 116, and the third barrier layer 116 may have substantially the same thickness as that of the first barrier layer 109 of the cell region. That is, the peri-gate PG may have a height greater than that of the bit line BL by the thickness of the second barrier layer 115.

The bit line BL of the cell region is formed between sidewalls of the bit line spacer 112, and the peri-gate PG of the peripheral circuit region is formed between sidewalls of a peri-gate spacer 119. The bit line spacer 112 and the peri-gate spacer 119 may include an insulation layer. For example, the bit line spacer 112 and the peri-gate spacer 119 may include a single layer that includes an oxide layer, a nitride layer, or an oxide nitride layer, or a stack layer thereof. The thickness of the bit line spacer 112 formed at both sidewalls of the bit line BL may be substantially equal to or different from those of the pen-gate spacer 119 formed at both sidewalls of the peri-gate PG.

In the semiconductor device having the aforementioned structure, the first barrier 109 is formed in the cell region, and the second barrier layer 115 and the third barrier layer 116 are stacked in the peripheral circuit region. Consequently, while substantially maintaining the characteristics of the peri-gate PG of the peripheral circuit region, the height of the bit line BL of the cell region may be lowered, and the parasitic capacitance of the bit line BL of the cell region may be reduced. As a consequence, a bit line sensing margin may be increased.

FIGS. 2A to 2I are sectional views illustrating the procedure for fabricating the semiconductor device having the structure illustrated in FIG. 1A.

Figure 2A:
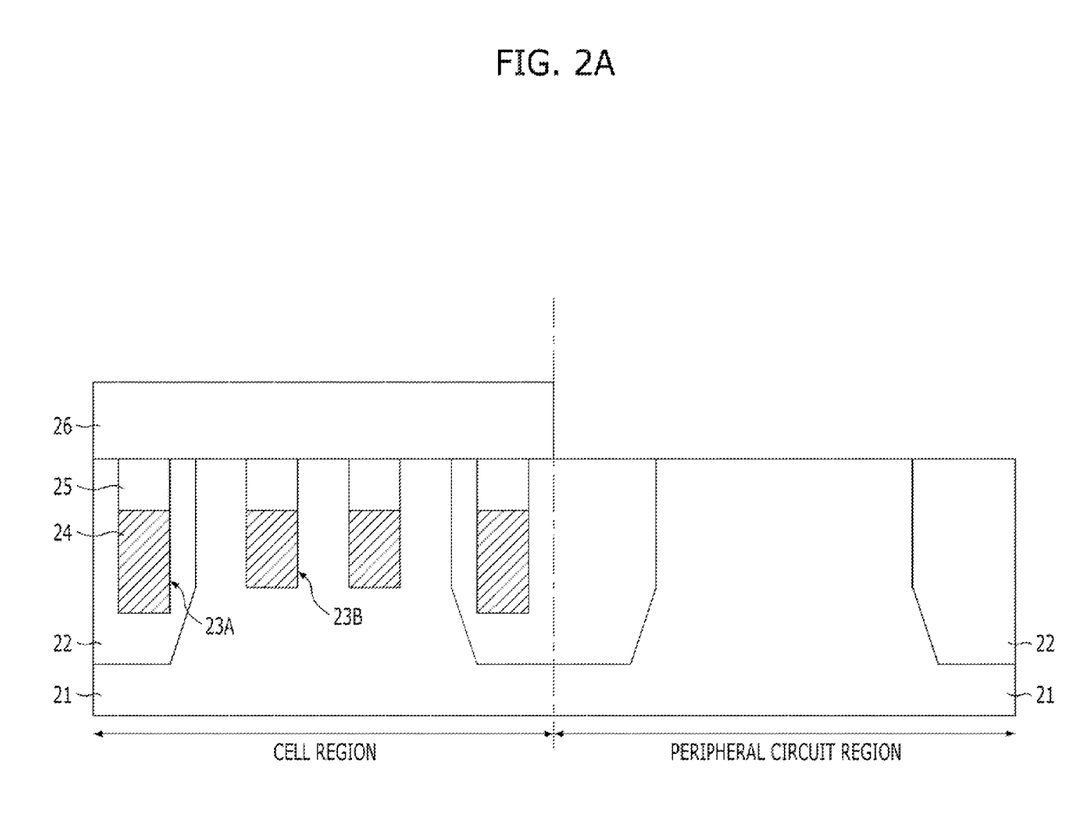
FIGS. 2A and 2I are diagrams illustrating a method for fabricating a semiconductor device in accordance with an embodiment of the present invention.

As illustrated in FIG. 2A, isolation layers 22 are formed in a substrate 21 having a cell region and a peripheral circuit region. Here, the isolation layers 22 is the same as the isolation layer 102 shown in FIG. 1A. Thus, an active region is defined in the cell region and the peripheral circuit region. The isolation layers 22 may be formed using a shallow trench isolation (STI) process.

A plurality of trenches 23A and 23B are formed in the substrate 21 of the cell region. An etching process for forming the trenches 23A and 23B may include anisotropic etching. The trenches 23A and 23B may be formed as line patterns simultaneously crossing the active regions and the isolation layers 22. At this time, the trenches 23B formed in the active region and the trenches 23A formed in the isolation layers 22 may have substantially the same depth, or the trenches 23A formed in the isolation layers 22 may have a depth greater than that of the trenches 233 formed in the active region.

A gate dielectric layer (not illustrated) is formed on the surface of the trenches 23A and 23B. The gate dielectric layer may be formed of an oxide layer, wherein the oxide layer may be formed using thermal oxidation or radical oxidation.

A gate conductive layer is formed on a resulting structure including the substrate 21 to fill the trenches 23A and 23B, and then planarization and etch-back are sequentially performed to form a plurality of gate electrodes 24 that partially fills the trenches 23A and 23B. The planarization may be performed using chemical mechanical polishing (CMP).

An insulation material is deposited on the resulting structure including the substrate 21 to fill the trenches 23A and 23B, and then planarization is performed to form a capping layer 25 on the gate electrodes that fill the trenches 23A and 23B. The capping layer 25 may be formed of an insulation layer. Alternatively, the capping layer 25 may fill the trenches 23A and 23B and simultaneously cover the resulting structure including the substrate 21.

Accordingly, it is possible to form a buried gate including the trench 23A or 23B, the gate dielectric layer (not illustrated) the gate electrode 24, and the capping layer 25.

An interlayer dielectric layer 26 is formed on the resulting structure including the substrate 21. The interlayer dielectric layer 26 may be formed of a single layer that has an oxide layer, a nitride layer, or an oxide nitride layer, or a stack layer thereof.

A peri-open mask (not illustrated) is formed on the interlayer dielectric layer 26, and the interlayer dielectric layer 26 is etched using the peri-open mask such that the substrate 21 of the peripheral circuit region is exposed.

Figure 2B:
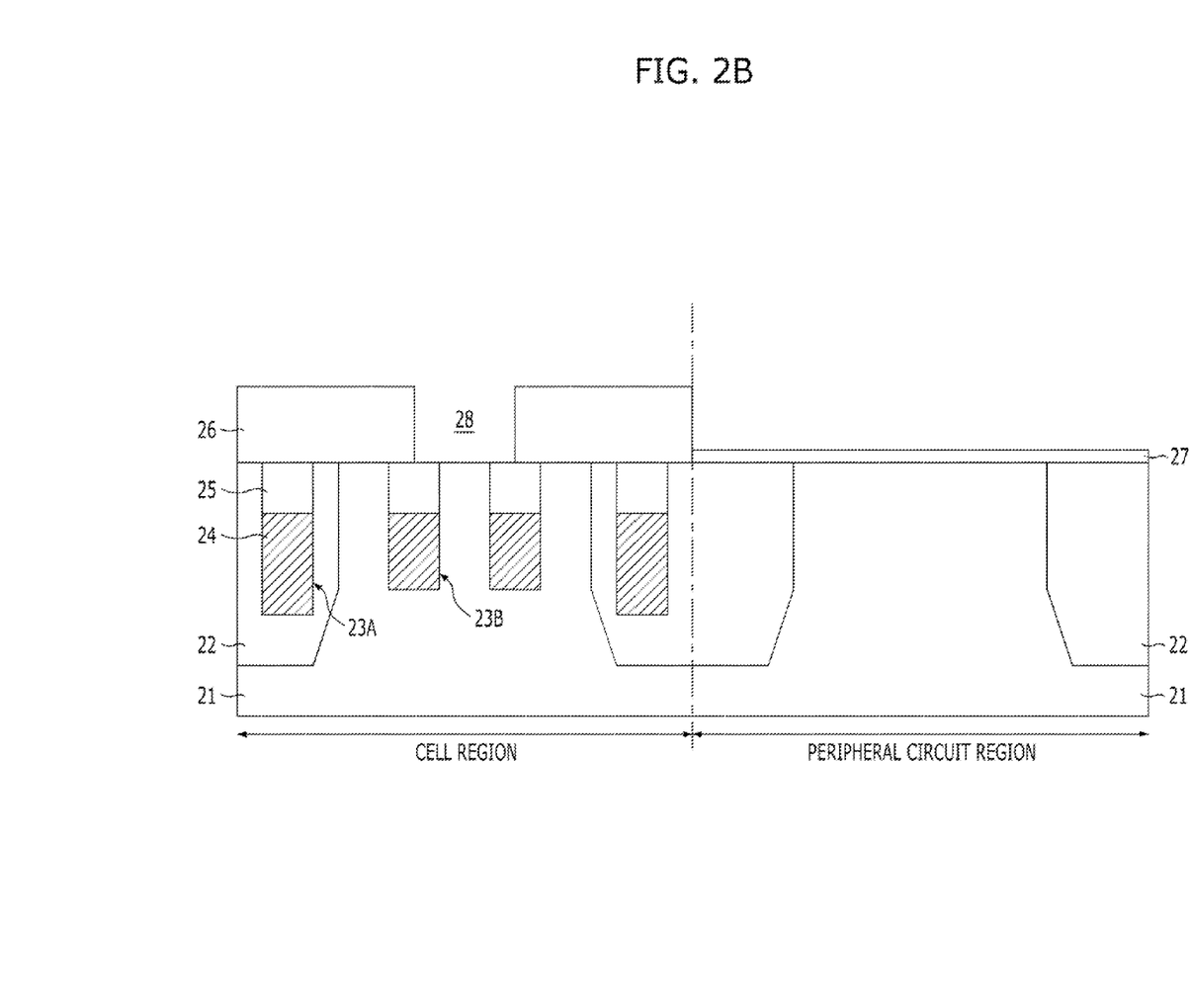

As illustrated in FIG. 2B, a gate dielectric layer 27 is formed on the substrate 21 of the peripheral circuit region. The gate dielectric layer 27 may include a silicon oxide layer, a silicon oxide nitride layer, or a high-k material. When the gate dielectric layer 27 includes the high-k material, an interface layer may be further formed between the substrate 21 and the gate dielectric layer 27. The interface layer may include a silicon oxide layer or a silicon oxide nitride layer. The high-k material has a dielectric constant greater than a dielectric constant (about 3.9) of silicon oxide $SiO_2$.

The interlayer dielectric layer 26 of the cell region is selectively etched to form a bit line contact hole 28 through which the substrate 21 between buried gates is exposed.

Figure 2C:
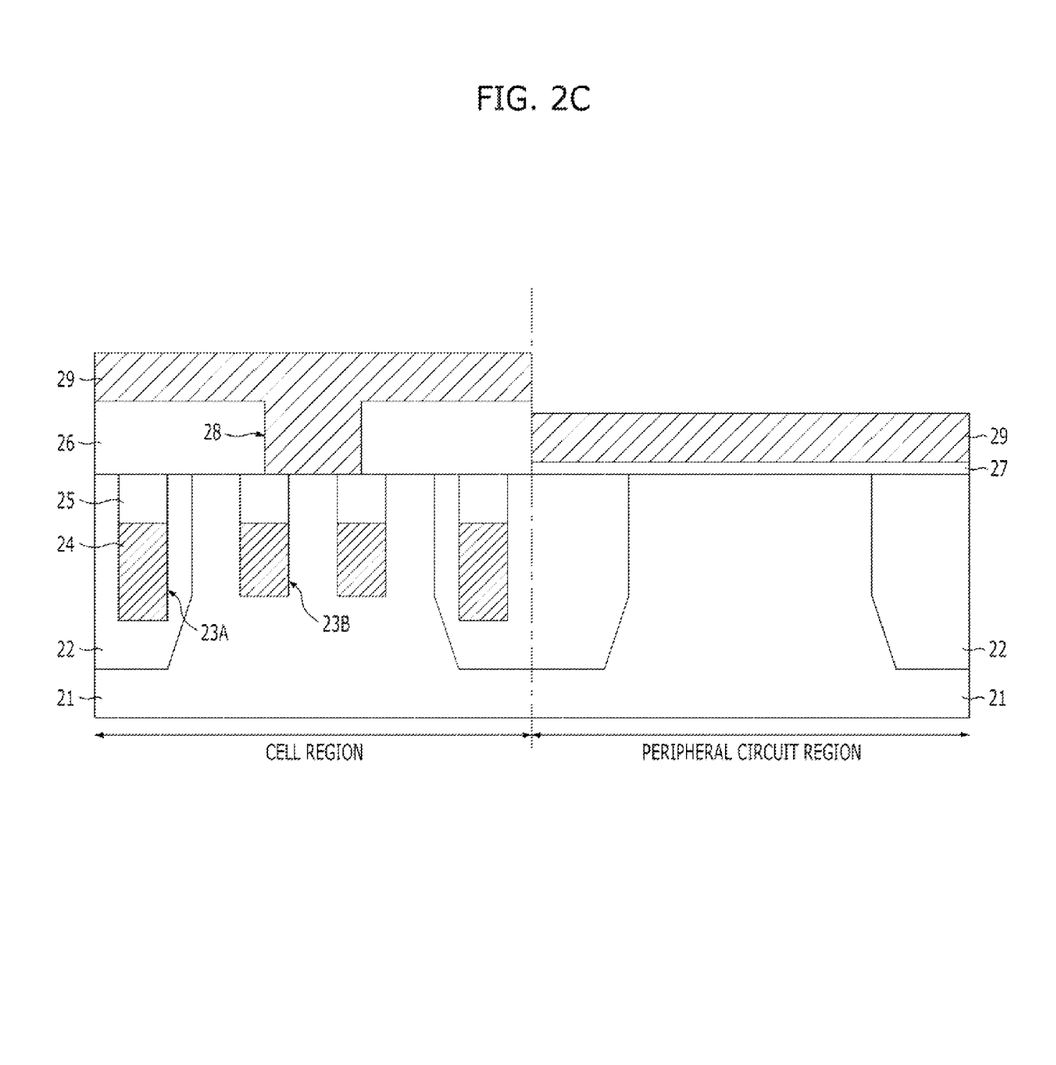

As illustrated in FIG. 2C, a first conductive layer 29 is formed on the resulting structure including the substrate 21 to fill the bit line contact hole 28 of the cell region, and also on the gate dielectric layer 27 of the peripheral circuit region. The first conductive layer 29 may include a silicon-containing layer. For example, the first conductive layer 29 may include a polysilicon layer.

The first conductive layer 29 of the cell region and the peripheral circuit region may be formed of an undoped layer, or a layer doped with an impurity.

Figure 2D:
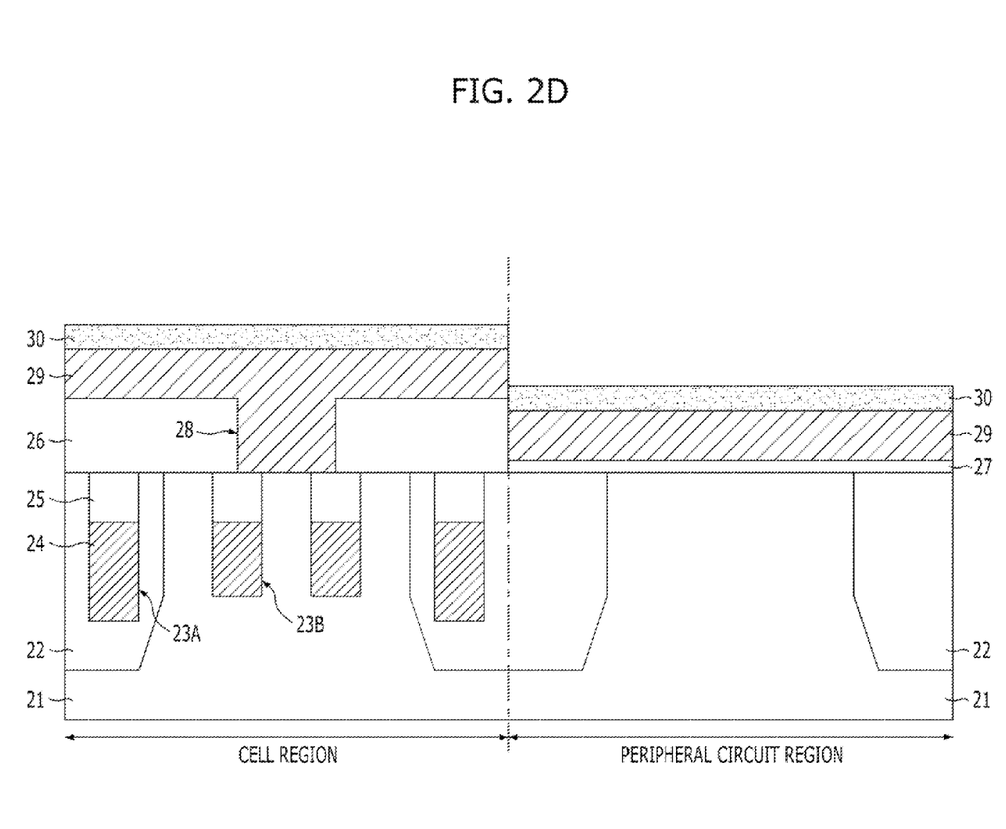

As illustrated in FIG. 2D, a first barrier layer 30 is formed on the first conductive layer 29. The first barrier layer 30 may have a stack layer in which different material layers are stacked. For example, the first barrier layer 30 may be formed by sequentially stacking a titanium layer (Ti), a tungsten nitride layer (WN), and a tungsten silicon nitride layer (WSiN). For example, the titanium layer may have a thickness of about 32 Å, the tungsten nitride layer may have a thickness of about 60 Å, and the tungsten silicon nitride layer may have a thickness of about 40 Å. The first barrier layer 30 may be formed through physical vapor deposition (PVD).

Figure 2E:
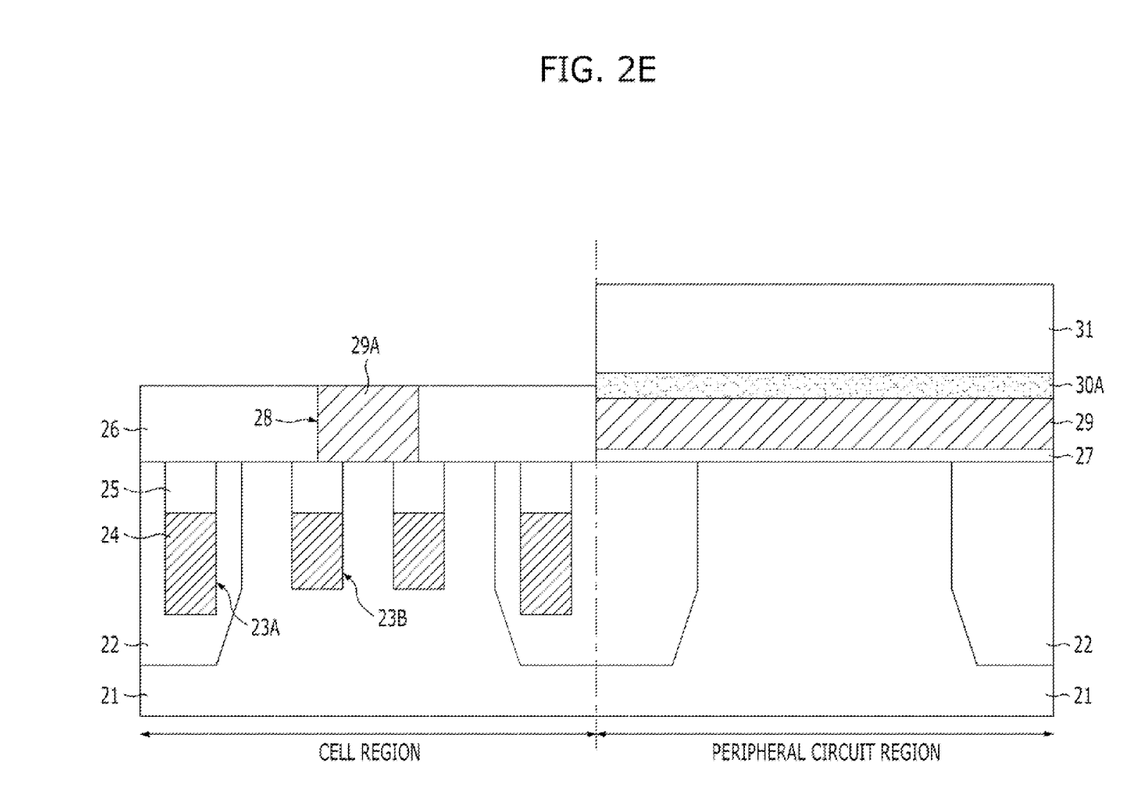

As illustrated in FIG. 2E, a cell open mask 31 is formed on the first barrier layer 30 of the peripheral circuit region. The first barrier layer 30 of the cell region is removed using the cell open mask 31. Consequently, a first barrier layer 30A is formed only on the peripheral circuit region, so that the characteristics of a peri-gate PG to be formed on the peripheral circuit region may be ensured. Furthermore, the first barrier layer 30 of the cell region is removed to reduce the height of a subsequent bit line BL, so that the parasitic capacitance may be reduced. As a consequence, a bit line sensing margin may be increased. Here, the first barrier layer 30A of FIG. 2E corresponds to the second barrier layer 115 of FIG. 1A.

The first conductive layer 29 is etched using the cell open mask 31. At this time, the first conductive layer 29 is etched until the surface of the interlayer dielectric layer 26 is exposed. Consequently, a preliminary bit line contact plug 29A including the first conductive layer 29 filled in the bit line contact hole 28 is formed.

Furthermore, the first conductive layer 29 of the cell region may not be etched. However, since the height of the subsequent bit line of the cell region is increased by the first conductive layer 29, parasitic capacitance is increased, resulting in a reduction of the bit line sensing margin. In this regard, to reduce the parasitic capacitance, the first conductive layer 29 may be etched.

Figure 2F:
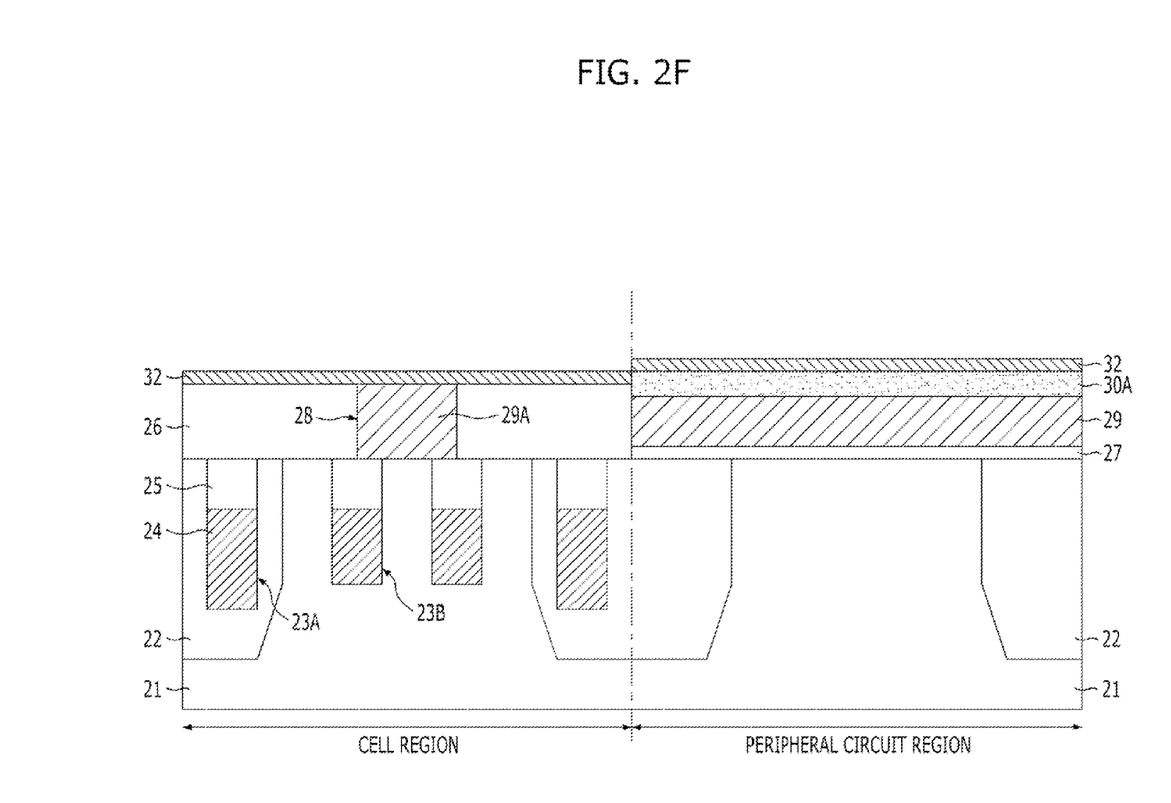

As illustrated in FIG. 2F, a second barrier layer 32 is formed on the resulting structure including the substrate 21. The second barrier layer 32 may be formed of a stack layer in which different material layers are stacked, and may have substantially the same structure as that of the first barrier layer 30A. At this time, to substantially prevent an increase in the height of the bit line to be formed on the cell region, the second barrier layer 32 may have a thickness smaller than that of the first barrier layer 30A. For example, the second barrier layer 32 may be formed on the resulting structure including the substrate 21 by stacking a titanium layer (Ti) a tungsten nitride layer (WN), and a tungsten silicon nitride layer (WSiN), wherein the titanium layer may have a thickness of about 25 Å, the tungsten nitride layer may have a thickness of about 20 Å, and the tungsten silicon nitride layer may have a thickness of about 20 Å. The second barrier layer 32 may be formed through physical vapor deposition (PVD). Here, the second barrier layer 32 of FIG. 2F corresponds to the first and third barrier layers 109 and 116 of FIG. 1A.

Hereinafter, the second barrier layer 32 of the cell region will be described. The titanium layer may react with the preliminary bit line contact plug 29A of the cell region to further form a titanium silicon layer TiSix between the preliminary bit line contact plug 29A and the titanium layer, and to form ohmic contact. The tungsten nitride layer may be dissolved between the preliminary bit line contact plug 29A and the titanium layer in a thermal process, and may react with a remaining titanium layer to further form a titanium nitride layer TIN between the tungsten nitride layer and the titanium layer. At this time, the titanium nitride layer may serve as a barrier. The tungsten silicon nitride layer is an amorphous layer, and increases the grain size of a subsequent tungsten layer to be formed on the titanium nitride layer to reduce surface resistance (Rs) of the subsequent tungsten layer. The aforementioned reaction of the second barrier layer 32 may be applied to the peripheral circuit region in the same manner.

Figure 2G:
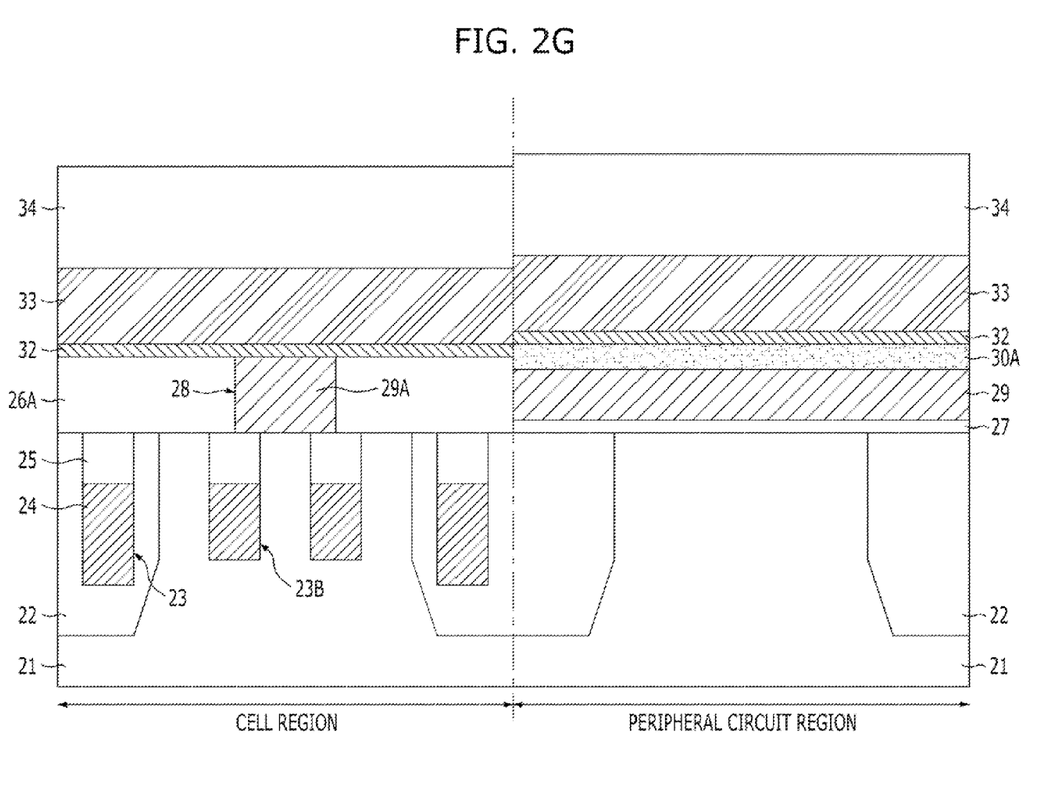

As illustrated in FIG. 2G, a second conductive layer 33 is formed on the second barrier layer 32.

The second conductive layer 33 may be formed using a material having resistance lower than that of the first conductive layer 29 to reduce the total resistance of a subsequent bit line of the cell region and a subsequent peri-gate of the peripheral circuit region. In this regard, the second conductive layer 33 may be formed of a metallic layer. The metallic layer may include a metal layer, a metal oxide layer, a metal nitride layer or the like. For example, the second conductive layer 33 may include a tungsten layer. The second conductive layer 33 may have a thickness of about 210 Å. To obtain resistance characteristics required in the semiconductor device, a thickness of about 210 Å or more is required. However, in the embodiment of the present invention, since the tungsten silicon nitride layer included in the second barrier layer 32 increases the grain size of the tungsten layer to reduce the surface resistance, the height of the second conductive layer 33 may be lowered. In this way, the height of the second conductive layer 33 is lowered, so that the parasitic capacitance of the bit line may be reduced. This may also increase the bit line sensing margin.

A hard mask layer 34 is formed on the second conductive layer 33. The hard mask layer 34 may include an insulation layer. For example, the hard mask layer 34 may have a single layer that includes an oxide layer, a nitride layer, an oxide nitride layer, or a carbon-containing layer, or a stack layer thereof. For example, the hard mask layer 34 may have a nitride layer, for example, a silicon nitride layer.

To compensate for an increase in resistance due to a reduction of the height of the bit line of the cell region, which is to be formed through a subsequent process, an insulation material may be substantially prevented from being formed on the resulting structure including the second conductive layer 33 when the hard mask layer 34 is formed. In detail, when the hard mask layer 34 has a nitride layer, since a reaction occurs in an interface between the hard mask layer 34 and the second conductive layer 33, the second conductive layer 33 is consumed to form an insulation material, so that the thickness of the second conductive layer 33 is reduced. When the second conductive layer 33 is reduced, the volume of the second conductive layer 33 is reduced, resulting in an increase in resistance. In this regard, to substantially prevent the thickness of the second conductive layer 33 from being reduced, the hard mask layer 34 may include a low-pressure nitride layer using a furnace.

For example, when the second conductive layer 33 is formed of a tungsten layer and the hard mask layer 34 is formed of a silicon nitride layer, it is possible to form the hard mask layer 34 as the low-pressure nitride layer using the furnace. In general, a unit cycle of: 1) loading a substrate in a chamber, 2) performing a cleaning process by injecting purge gas into the chamber and discharging the purge gas to an exterior, and 3) injecting reaction gas into the chamber to deposit a nitride layer may be repeatedly performed for multiple times. However, in the embodiment of the present invention, to substantially prevent an insulation material from being formed between the second conductive layer 33 and the hard mask layer 34, several cleaning steps and deposition steps are set as a unit cycle, and the unit cycle is repeated for multiple times.

In more detail, a unit cycle includes 1) loading a substrate in a chamber, 2) repeatedly performing a cleaning process for multiple times by injecting purge gas into the chamber and discharging the purge gas to an exterior, and 3) injecting reaction gas into the chamber to deposit a nitride layer is repeatedly performed to form a low-pressure nitride layer. At this time, prior to the deposition of the nitride layer, the injection of the purge gas is performed for several times to clean the interior of the chamber, so that a formation of insulation material formed between the second conductive layer 33 and the hard mask layer 34 may be substantially prevented. Consequently, the surface resistance (Rs) is reduced. The injecting of the purge gas may be performed using nitrogen gas, and an amount of the nitrogen gas in the range of about 5500 sccm to 6500 sccm may be used. The deposition of the nitride layer may be performed using ammonia gas and dichlorosilane (DCS; $SiH_2Cl_2$) an amount of the ammonia gas in the range of about 1000 sccm to 1400 sccm may be used, and an amount of the DCS gas in the range of about 100 sccm to 140 sccm may be used. At this time, the pressure is lower than 0.25 torr. When the process is performed in the pressure lower than 0.25 torr, deposition characteristic such as step coverage may be deteriorated. When the process is performed in pressure greater than 0.25 torr, since a deposition speed is reduced, productivity may be reduced. A process of forming the hard mask layer 34 may be performed in the temperature in the range of about 710° C. to 730° C.

Through such a series of processes as described above, a bit line stack, which includes the preliminary bit line contact plug 29A, the second barrier layer 32, the second conductive layer 33, and the hard mask layer 34 of the cell region, is formed. Furthermore, a peri-gate stack, which includes the gate dielectric layer 27, the first conductive layer 29, the first barrier layer 30, the second barrier layer 32, the second conductive layer 33, and the hard mask layer 34 of the peripheral circuit region, is formed.

Figure 2H:
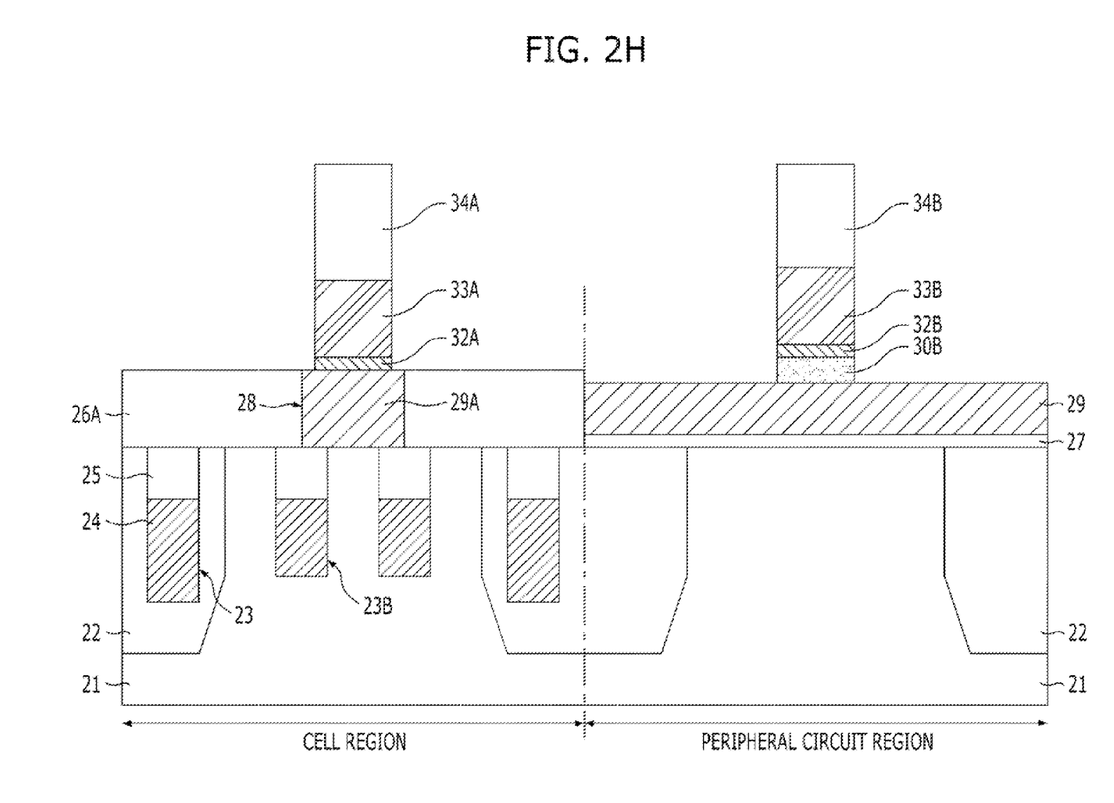

As illustrated in FIG. 2H, a second mask pattern (not illustrated) is formed on the hard mask layer 34. The second mask pattern may be formed using a photoresist layer.

Patterning of the bit line of the cell region and patterning of the peri-gate of the peripheral circuit region are simultaneously performed using the second mask pattern as an etch mask. For example, the hard mask layer 34, the second conductive layer 33, and the second barrier layer 32 of the cell region are sequentially etched to form a hard mask layer 34A, a second conductive layer 33A, and a second barrier layer 32A. Simultaneously, the hard mask layer 34, the second conductive layer 33 the second barrier layer 32, and the first barrier layer 30 of the peripheral circuit region are etched to form a hard mask layer 34B a second conductive layer 33B, a second barrier layer 32B, and a first barrier layer 30B.

Figure 2I:
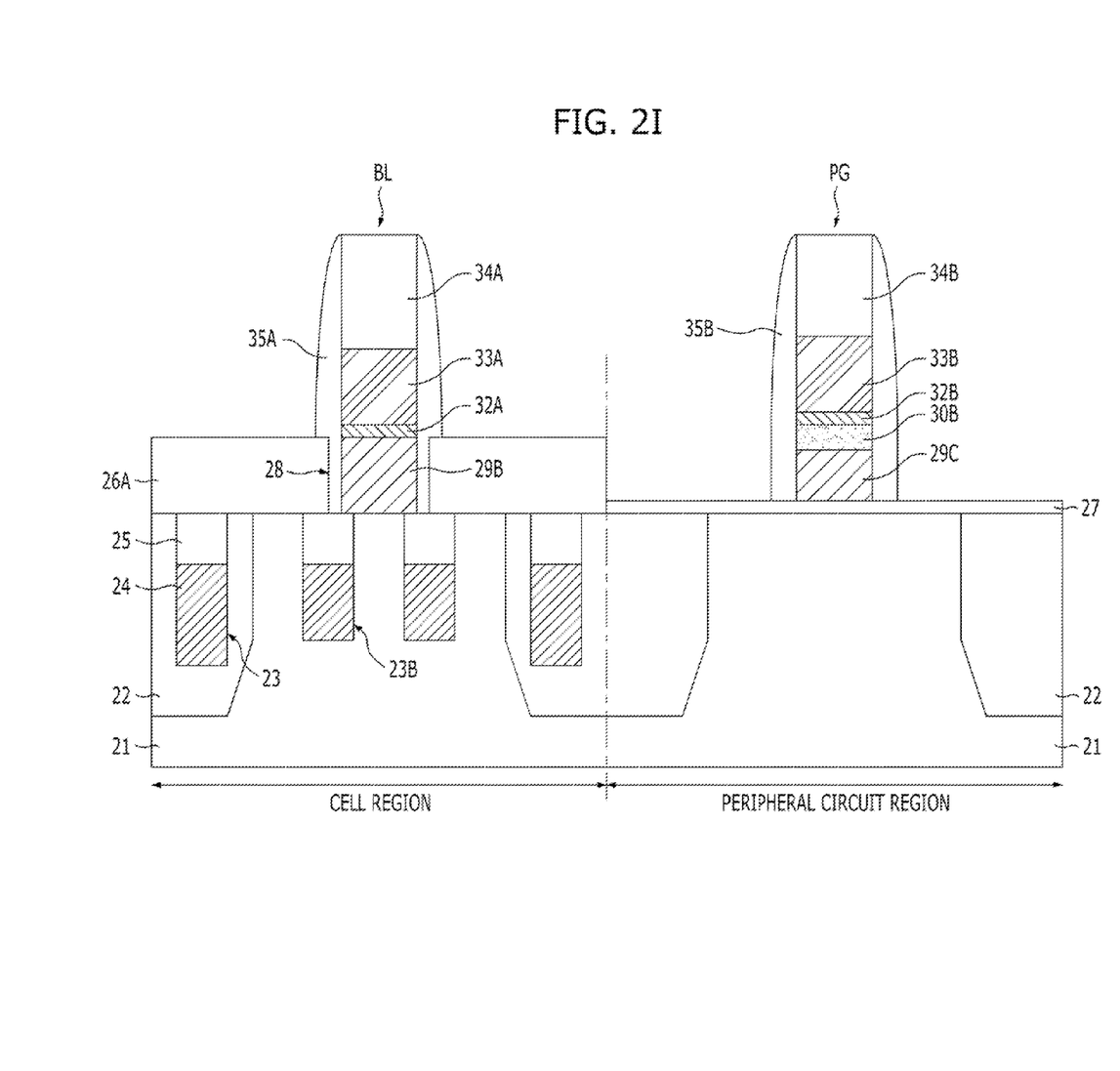

As illustrated in FIG. 2I, the preliminary bit line contact plug 29A of the cell region and the first conductive layer 29 of the peripheral circuit region are simultaneously etched using the second mask pattern (not illustrated) as an etch mask, so that a bit line contact plug 29B of the cell region is formed and a first gate electrode 29C is formed in the peripheral circuit region.

The bit line contact plug 29B is formed in the cell region, resulting in the formation of the bit line BL in which the bit line contact plug 29B, the second barrier layer 32A, the second conductive layer 33A, and the hard mask layer 34A are stacked. The first gate electrode 29C is formed in the peripheral circuit region, resulting in the formation of the pen-gate PG in which the first gate electrode 29C, the first barrier layer 30B, the second barrier layer 32B, and the second gate electrode 33B are stacked on the gate dielectric layer 27.

Then, the second mask pattern is removed. Furthermore, a bit line spacer 35A may be formed on sidewalls of the bit line BL and the bit line contact plug 29A of the cell region. Simultaneously, a peri-gate spacer 35B may be formed on both sidewalls of the pen-gate PG.

Meanwhile, law concentration source/drain regions may be formed before the pen-gate spacer 35B is formed, or high concentration source/drain regions may be formed after the peri-gate spacer 35B is formed.

In the embodiment of the present invention, the GBL etching process is described. In the GBL etching process, the bit line BL of the cell region and the peri-gate spacer 35B of the peripheral circuit region are simultaneously formed. The bit line BL of the cell region may have an inner GBL (IGBL) structure. In the IGBL structure, a line width of the bit line contact plug 29B is formed to be substantially equal to that of the bit line BL. However, the line widths of the bit line contact plug 29B and the bit line BL are smaller than that of the bit line contact hole 28. Consequently, an overlay margin with a subsequent storage node contact (SNC) may be ensured.

Figure 3:
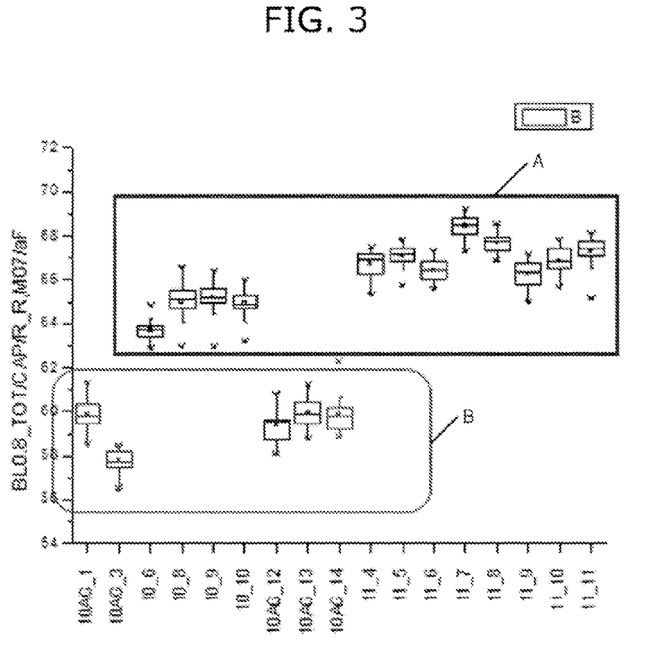
FIG. 3 is a graph illustrating bit line parasitic capacitance of a semiconductor device in accordance with an embodiment of the present invention.

FIG. 3 is a graph illustrating bit line parasitic capacitance of the semiconductor device in accordance with the embodiment of the present invention.

As illustrated in FIG. 3, section 'A' indicates a graph when barrier layers of the bit line and the peri-gate are simultaneously formed (i.e. the heights of the bit line and the peri-gate are substantially equal to each other), and section 'B' indicates a graph when a barrier layer formed on the bit line and a barrier layer formed on the peri-gate have different structures (i.e. the height of the bit line is lower than that of the peri-gate) as with the embodiment of the present invention.

Referring to the section 'B' as compared with the section 'A', when the height of the bit line is lower than that of the peri-gate, a value of the bit line parasitic capacitance may be reduced according to the graph. Consequently, the height of the bit line may be reduced in accordance with the embodiment of the present invention, so that the parasitic capacitance may be reduced, and the bit line sensing margin may increase.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a substrate including a cell region and a peripheral circuit region;
   buried gates formed in the substrate of the cell region;
   a bit line formed over the cell region between the buried gates and including a first barrier layer; and
   a gate formed over the peripheral circuit region and including a second barrier layer and a third barrier layer,
   wherein the second barrier layer has a thickness greater than that of the first barrier layer to allow the bit line to have a height lower than that of the gate,
   wherein each of the first barrier layer, the second barrier layer, and the third barrier layer comprises a stack layer including a titanium layer, a tungsten nitride layer, and a tungsten silicon nitride layer,
   wherein a thickness of the tungsten nitride layer and the tungsten silicon nitride layer included in the second barrier layer is greater than a thickness of the tungsten nitride layer and the tungsten silicon nitride layer included in the first barrier layer.

2. The semiconductor device of claim 1, wherein the first barrier layer has a thickness substantially the same as that of the third barrier layer.

3. The semiconductor device of claim 1, further comprising:
   a bit line contact plug formed under the first barrier layer to be coupled to the buried gates.

4. The semiconductor device of claim 3, wherein the bit line further comprises a first conductive layer formed over the first barrier layer.

5. The semiconductor device of claim 4, wherein the gate further comprises a second conductive layer formed under the second barrier layer, and a third conductive layer formed over the third barrier layer.

6. The semiconductor device of claim 5, wherein the bit line contact plug and the second conductive layer comprise a polysilicon layer.

7. The semiconductor device of claim 5, wherein the first conductive layer and the third conductive layer comprise a tungsten layer.

8. A method for fabricating a semiconductor device, comprising:
   forming a cell region and a peripheral circuit region in a substrate;
   forming a first conductive layer over the substrate including the cell region and the peripheral circuit region;

forming a first barrier layer over the first conductive layer;
etching the first barrier layer and the first conductive layer to form a bit line contact plug in the cell region; thereby remaining the first barrier layer in the peripheral circuit region;
simultaneously forming a second barrier layer over the cell region and the peripheral circuit region;
forming a second conductive layer over the second barrier layer; and
etching the second barrier layer, the second conductive layer to form a bit line on the cell region, and etching the first barrier layer, the second barrier layer, and the second conductive layer to form a gate in the peripheral circuit region,
wherein the first barrier layer has a thickness greater than that of the second barrier layer to allow the bit line to have a height lower than that of the gate,
wherein each of the second barrier layer in the cell region, the second barrier layer in the peripheral circuit region and the first barrier layer in the peripheral circuit region comprises a stack layer including a titanium layer, a tungsten nitride layer, and a tungsten silicon nitride layer,
wherein a thickness of the tungsten nitride layer and the tungsten silicon nitride layer included in the first barrier layer is greater than a thickness of the tungsten nitride layer and the tungsten silicon nitride layer included in the second barrier layer over the cell region.

9. The method of claim 8, wherein the first conductive layer comprises a polysilicon layer and the second conductive layer comprises a tungsten layer.

10. The method of claim 9, further comprising:
forming a hard mask layer of a nitride layer over the second conductive layer of the tungsten layer.

11. The method of claim 8, wherein the etching of the first barrier layer and the first conductive layer comprises:
forming a cell open mask over the first barrier layer of the peripheral circuit region; and
etching the first barrier layer and the first conductive layer of the cell region using the cell open mask.

12. The method of claim 8, wherein the first barrier layer and the second barrier layer are formed by sequentially stacking a titanium layer, a tungsten nitride layer, and a tungsten silicon nitride layer.

13. The method of claim 8, further comprising:
forming a plurality of buried gates in the substrate of the cell region.

14. The method of claim 13, further comprising:
forming an interlayer dielectric layer over the substrate of the cell region after forming the plurality of buried gates; and
etching the interlayer dielectric layer to form a contact hole for the bit line contact plug in the cell region.

15. The method of claim 14, wherein the contact hole is disposed to be coupled with the buried gates in the cell region.

16. The method of claim 15, wherein each of the plurality of the buried gates comprises a gate electrode and a capping layer over the gate electrode.

17. The method of claim 16, further comprising:
forming a gate dielectric layer between the first conductive layer and the substrate in the peripheral circuit region.

* * * * *